US010826020B2

(12) United States Patent
Palles-Dimmock et al.

(10) Patent No.: US 10,826,020 B2
(45) Date of Patent: Nov. 3, 2020

(54) QUANTUM DOT LED STRUCTURE HAVING OPTICALLY TRANSPARENT LAYER ON PARTIALLY TRANSMITTING REFLECTOR FOR ENHANCED EMISSION

(71) Applicant: Sharp Kabushiki Kaisha, Osaka (JP)

(72) Inventors: James Andrew Robert Palles-Dimmock, Oxford (GB); Tim Michael Smeeton, Oxford (GB); David James Montgomery, Oxford (GB); Nathan James Smith, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 41 days.

(21) Appl. No.: 16/193,183

(22) Filed: Nov. 16, 2018

(65) Prior Publication Data

US 2020/0161585 A1 May 21, 2020

(51) Int. Cl.
*H01L 51/52* (2006.01)
*H01L 51/50* (2006.01)
(Continued)

(52) U.S. Cl.
CPC ........ *H01L 51/5268* (2013.01); *H01L 27/322* (2013.01); *H01L 27/3211* (2013.01);
(Continued)

(58) Field of Classification Search
CPC ............. H01L 51/5268; H01L 27/3211; H01L 27/322; H01L 27/3232; H01L 51/0037;
(Continued)

(56) References Cited

U.S. PATENT DOCUMENTS 8,368,727 B2  2/2013  Smith et al.
8,471,268 B2  6/2013  Moon et al.
(Continued)

OTHER PUBLICATIONS

Yang et al.: "High-efficiency light-emitting devices based on quantum dots with tailored nanostructures", Nature Photonics, Published Online: Mar. 23, 2015, http://www.nature.com/doifinder/10.1038/nphoton.2015.36.
(Continued)

*Primary Examiner* — Michael Jung
(74) *Attorney, Agent, or Firm* — Renner, Otto, Boisselle & Sklar, LLP

(57) ABSTRACT

A light-emitting device for use in a display device has enhanced directional light emission, and enhanced on-axis light emission in particular. A light-emitting device includes a layer structure that includes from a non-emitting side: a first electrode layer; a first charge transport layer; an emissive layer; a second charge transport layer; a second electrode layer; an optically transparent layer; and a partially transmitting reflector layer. The light-emitting device comprises a plurality of regions and each region emits light of a different wavelength, such as for example red, green, and blue light-emitting regions. The optically transparent layer is present in at least one of the plurality of regions. The optically transparent layer may be present in more than one of the plurality of regions, and a thickness of the optically transparent layer may differ in different regions to optimize light emission at different wavelengths. The light-emitting device may include a scattering layer that scatters the emitted light, which may be switchable to permit different viewing angle display modes.

20 Claims, 12 Drawing Sheets

(51) Int. Cl.
*H01L 27/32* (2006.01)
*H01L 51/00* (2006.01)

(52) U.S. Cl.
CPC ...... *H01L 27/3232* (2013.01); *H01L 51/0037* (2013.01); *H01L 51/502* (2013.01); *H01L 51/5056* (2013.01); *H01L 51/5072* (2013.01); *H01L 51/5218* (2013.01); *H01L 51/5221* (2013.01); *H01L 51/5271* (2013.01); *H01L 2251/301* (2013.01); *H01L 2251/305* (2013.01); *H01L 2251/5353* (2013.01); *H01L 2251/558* (2013.01)

(58) Field of Classification Search
CPC .............. H01L 51/502; H01L 51/5056; H01L 51/5072; H01L 51/5218; H01L 51/5221; H01L 51/5271

See application file for complete search history.

(56) References Cited

U.S. PATENT DOCUMENTS

| | | | |
|---|---|---|---|
| 8,536,781 B2 | 9/2013 | Lee et al. | |
| 8,894,243 B2 | 11/2014 | Cho et al. | |
| 9,583,727 B2 | 2/2017 | Cho et al. | |
| 2008/0297036 A1* | 12/2008 | Noh | H01L 51/5036 313/504 |
| 2012/0261683 A1* | 10/2012 | Sonoyama | H01L 27/3211 257/89 |
| 2015/0084012 A1 | 3/2015 | Kim et al. | |
| 2015/0124009 A1* | 5/2015 | Jung | G09G 3/3225 345/694 |
| 2015/0340410 A1 | 11/2015 | Hack et al. | |
| 2017/0062751 A1* | 3/2017 | Park | H01L 27/3211 |
| 2017/0207281 A1 | 7/2017 | Hack et al. | |
| 2018/0247982 A1* | 8/2018 | Kim | H01L 51/5234 |

OTHER PUBLICATIONS

Cho et al.: "A Black Metal-dielectric Thin Film for High-contrast Displays", Journal of the Korean Physical Society, vol. 55, No. 2, Aug. 2009, pp. 501-507.

* cited by examiner

FIG. 9

| 81b | 81a | 81b | 81a |
|-----|-----|-----|-----|
| 83a | 83b | 83a | 83b |
| 82b | 82a | 82b | 82a |
| 81a | 81b | 81a | 81b |

1005

→ Etc.

→ Etc.

QUANTUM DOT LED STRUCTURE HAVING OPTICALLY TRANSPARENT LAYER ON PARTIALLY TRANSMITTING REFLECTOR FOR ENHANCED EMISSION

TECHNICAL FIELD

The present invention relates to a layer structure used for an emissive display device, such as for a quantum dot light-emitting diode (QLED) display device or an organic light-emitting diode (OLED) display device, that provides enhanced on-axis light emission.

BACKGROUND ART

A conventional light-emitting device is described in (DOI: 10.1038/nphoton.2015.36). To achieve optimum extraction of light from each of red, green, and blue pixels in a display device a different total pixel thickness is required to optimize the microcavity that is formed by an emissive layer being disposed between two partially or wholly reflective electrodes.

FIG. 1 is a drawing depicting an exemplary representation of such a light-emitting device. As a structural overview, a light-emitting device 100 is formed on a substrate 101 and includes an anode 102 and a cathode 107, and a light-emitting or emissive layer 105 containing a material that emits light of either red 14, green 15, or blue 16 wavelengths. Within the light-emitting emissive layer 105, light is produced upon electron and hole recombination to generate the referenced light, and the emissive layer is composed differently in respective regions to emit the different wavelengths of light from red 11, green 12, and blue 13 pixels, sub-pixel or like color regions. The emissive layer 105 may be an inorganic or organic semiconductor layer, or a layer of quantum dots (QDs). At least one hole transport layer, in this example layers 103 and 104, is located between the anode 102 and the emissive layer 105, which provides transport of holes from the anode and injection of holes into the emissive layer. Similarly, at least one electron transport layer, in this example layers 106, 108, and 109 respectively for each pixel 11, 12, and 13, is located between the cathode 107 and emissive layer 105, which provides transport of electrons from the cathode and injection of electrons into the emissive layer. The thickness of the electron transport layers 106, 108, and 109 is different for each of the pixels red 11, green 12, and blue 13 to optimize the microcavity effect and enhance the extraction of light of a given wavelength. For such optimization, the blue pixel 13 has the thinnest electron transport layer 109, since blue light 16 has the shortest wavelength. Correspondingly, the red pixel 11 has the thickest electron transport layer 106 since red light 14 has the longest wavelength, and the thickness of electron transport layer 108 of the green pixel 12 is intermediate between thicknesses of layers 106 and 109 as the green light 15 has an intermediate wavelength between that of red light 14 and blue light 16.

A significant drawback of such a design is that each pixel must have a different thickness of electron transport layer, necessitating patterning of the functional layers. Patterning of functional layers that act as the charge transport layers (e.g., electron or hole transport layers) constitutes a complex process that renders light emission optimization relatively costly and difficult to achieve.

Further enhancement of the extraction of light, and control of the angular distribution of the light, from organic light-emitting diode (OLED) and quantum dot light-emitting diode (QLED) pixels is possible by recognizing and further exploiting cavity effects that are present in such thin layers. For example, US 2006/0158098 (Raychaudhuri et al., published Jul. 20, 2006) describes a top emitting structure, and U.S. Pat. No. 9,583,727 (Cho et al., issued Feb. 28, 2017) and U.S. Pat. No. 8,471,268 (Moon et al., issued Jun. 22, 2013) describe an OLED and QLED structure with light emitting regions between reflective areas, one of which is partially transmitting. There also exist methods for improving the luminance of such cavities. For example, US 2015/0084012 (Kim et al., published Mar. 26, 2015) describes the use of dispersive layers in an OLED structure, U.S. Pat. No. 8,894,243 (Cho et al., issued Nov. 25, 2014) describes the use of microstructure scattering for improving efficiency, and US 2015/0340410 (Hack et al., published Nov. 26, 2015) and US 2017/0207281 (Hack et al., published Jul. 20, 2017) describe OLED color pixels with different optical path lengths, although no fabrication details are given.

U.S. Pat. No. 8,536,781 (Lee et al, issued Sep. 17, 2013) and an associated non-patent literature (DOI: 10.3938/jkps.55.501) describe additional layers applied on top of a standard OLED cell with the aim of enhancing absorption of incident light to improve contrast ratio of a display. U.S. Pat. No. 8,536,781 necessarily has a top anti-reflective coating, and the additional layers are necessarily uniform for all of the red, green and blue pixels because the aim is to optimize absorption of the incident light, which is uniform across all pixels. U.S. Pat. No. 8,368,727 (Smith et al., issued Feb. 5, 2013) describes a display device that has a plurality of pixel groups, wherein each pixel group includes a first pixel having a first type of luminance against viewing angle response and a second pixel having a second type of luminance against viewing angle response, and a controller for driving the pixel groups to enable a display that can have a wide viewing angle public mode and a narrow viewing angle private mode.

Conventional designs for light-emitting devices as described above optimize the extracted light by altering the thicknesses of functional layers of the OLED or QLED. As referenced above, however, patterning of functional layers that act as the charge transport layers (e.g., electron or hole transport layers) constitutes a complex process that renders light emission optimization relatively costly and difficult to achieve. In particular, altering thicknesses of the functional layers can result in the optical properties and electronic properties of the layers being in conflict when the functional layer thickness is optimized. For example, a thicker electron transport layer for a red pixel is preferable for optical extraction, as detailed with reference to FIG. 1 (layer 106), but this can result in an increase in the series resistance presented by such layer. Furthermore, patterning of the functional layers to give different thicknesses for different color pixels necessitates some form of masking or etching, which can detrimentally impact the electronic properties of the functional layers and increase cost and complexity of manufacture. Conventional configurations, therefore, have not optimized light extraction and emission while maintaining other optimum device properties (e.g., electronic properties and adequate view angle control) in a manner that is efficient to manufacture.

SUMMARY OF INVENTION

The present invention provides a layer structure used for an emissive device, in particular for a quantum dot light-emitting diode (QLED) display device or an organic light-emitting diode (OLED) display device, that provides enhanced on-axis light emission. The present invention uses an additional layer or layers on top of a conventional QLED or OLED pixel, such as described in FIG. 1, to optimize extraction efficiency and angular light profile while allowing the functional layers to be selected optimally for the electronic properties of the device without additional processing of the functional layers.

In particular, embodiments of the present invention include an additional substantially transparent region and a partially reflective layer disposed on top of the functional charge transport and emissive layers. By optimizing the thickness of the substantially transparent region, the light emitted in a particular direction can be maximized because the transparent region and partially reflective layer form a cavity effect, and the direction of light emission depends on the total path length seen by an emitted light ray. The thickness of the substantially transparent region can be varied or different for each of red, green, and blue light emitting pixels so that light extraction is separately optimized for each color of light emission. Typical materials for such a transparent region, such as for example $SiO_2$, indium tin oxide (ITO), Poly(methyl methacrylate) (PMMA), or SU-8 photoresist are robust and processed easily by standard manufacturing methods. Accordingly, simple processing of the transparent region to achieve optimal thickness can be performed while avoiding the more complex and potentially detrimental processing of the functional layers.

An aspect of the invention, therefore, is an enhanced light-emitting device that has enhanced directional light emission, and enhanced on-axis light emission in particular. In exemplary embodiments, a light-emitting device comprises a layer structure that includes from a non-emitting side: a first electrode layer; a first charge transport layer; an emissive layer; a second charge transport layer; a second electrode layer; an optically transparent layer; and a partially transmitting reflector layer. The light-emitting device comprises a plurality of regions and each region emits light of a different wavelength, such as for example red, green, and blue light-emitting regions. The optically transparent layer is present in at least one of the plurality of regions. The optically transparent layer may be present in more than one of the plurality of regions, and a thickness of the optically transparent layer differs in at least two of the plurality of regions, and/or the optically transparent layer may be present in each of the plurality of regions, and a thickness of the optically transparent layer differs in each of the plurality of regions. The light-emitting device further may include a scattering layer disposed on the partially transmitting reflector that scatters the emitted light, and the scattering layer may be switchable between a scattering mode that scatters light and a non-scattering mode that does not scatter light to permit different viewing angle display modes.

Another aspect of the invention is a display system including an array of light-emitting devices according to any of the embodiments, and an image control unit configured to receive an input image and drive the array of light-emitting devices to generate an output image. In exemplary embodiments, the scattering layer for each of a plurality of regions may be switchable between a scattering mode and a non-scattering mode to enable generation of multiple different patterns of the scattering layer. When the light-emitting devices of the display system include a switchable scattering layer, the image control unit is configured to pattern the scattering layer so that a first set of regions of the plurality of regions has a first type of luminance against viewing angle response, and a second set of regions of the plurality of regions has a second type of luminance against viewing angle response, and wherein the first and second luminance against viewing angle responses are different from each other. The first luminance against viewing angle response may be a narrow viewing angle mode and the second luminance against viewing angle response may be a wide viewing angle mode relative to the narrow viewing angle mode. The display system further may include a memory device that stores a look-up table that corresponds to a plurality of scattering layer patterns, and the image control unit is configured to obtain the predetermined pattern from the look-up table from among the plurality of scattering layer patterns.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 9 is a drawing depicting a plan view of pixels in an exemplary OLED or QLED display device illustrating an example using a patterned scattering layer.

DESCRIPTION OF EMBODIMENTS

Figure 1:
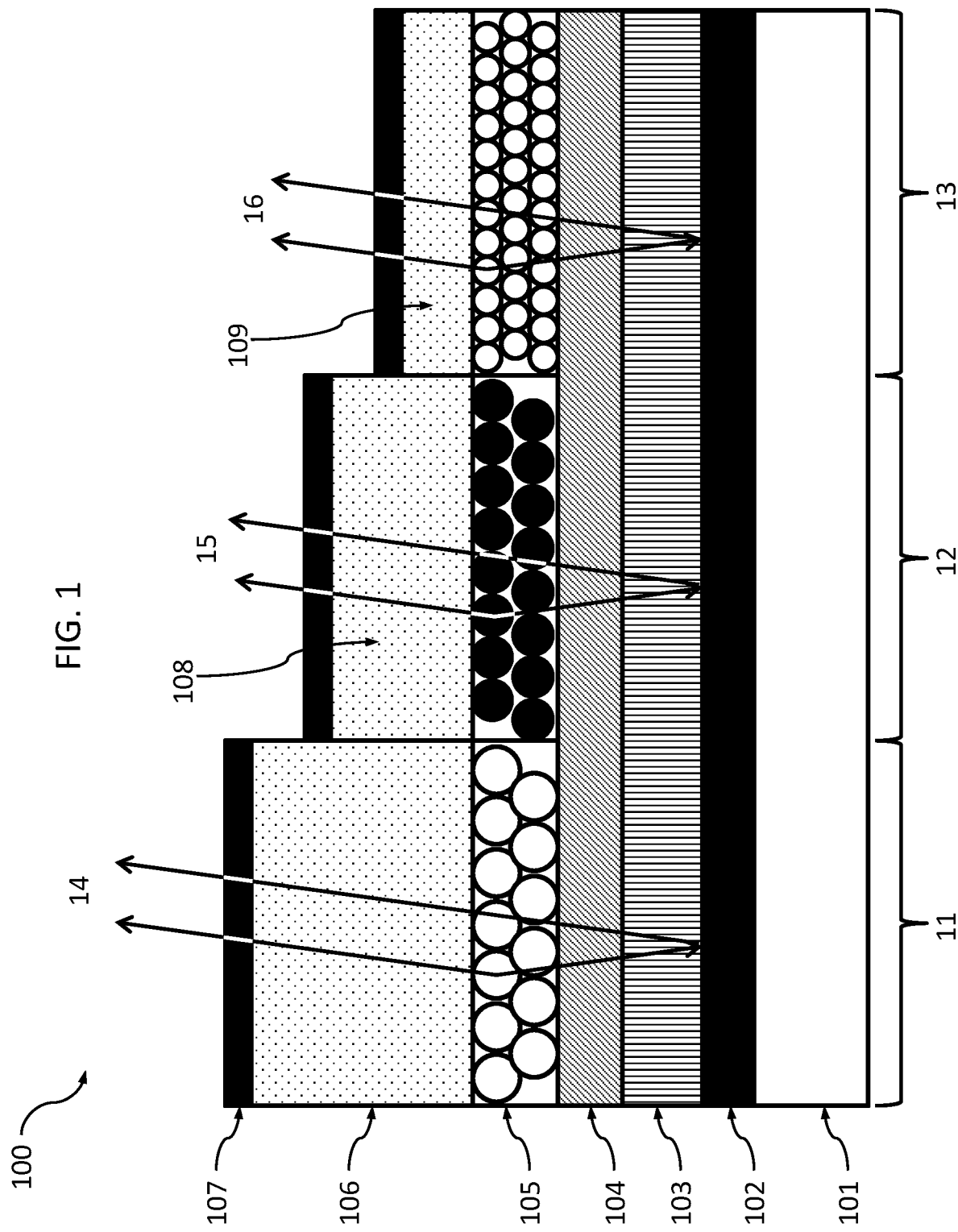
FIG. 1 is a drawing depicting a conventional layer structure for a light emitting device showing three pixels with different electron transport layer (ETL) thicknesses to optimize extraction of light.

Embodiments of the present invention will now be described with reference to the drawings, wherein like reference numerals are used to refer to like elements throughout. It will be understood that the figures are not necessarily to scale.

The present invention provides a layer structure used for an emissive device, in particular for a quantum dot light-emitting diode (QLED) display device or an organic light-emitting diode (OLED) display device, that provides enhanced on-axis light emission. The present invention uses an additional layer or layers on top of a conventional QLED or OLED pixel, such as described in FIG. 1, to optimize extraction efficiency and angular light profile while allowing the functional layers to be a selected optimally for the electronic properties of the device without additional processing of the functional layers.

In particular, embodiments of the present invention include an additional substantially transparent region and a partially reflective layer disposed on top of the functional charge transport and emissive layers. By optimizing the thickness of the substantially transparent region, the light emitted in a particular direction can be maximized because the transparent region and partially reflective layer form a cavity effect, and the direction of light emission depends on the total path length seen by an emitted light ray. The thickness of the substantially transparent region can be varied or different for each of red, green, and blue light emitting pixels or regions so that light extraction is separately optimized for each color of light emission. Typical materials for such a transparent region, such as for example $SiO_2$ and indium tin oxide (ITO), are robust and processed easily by standard manufacturing methods. Accordingly, simple processing of the transparent region to achieve optimal thickness can be performed while avoiding the more complex and potentially detrimental processing of the functional layers.

Figure 2:
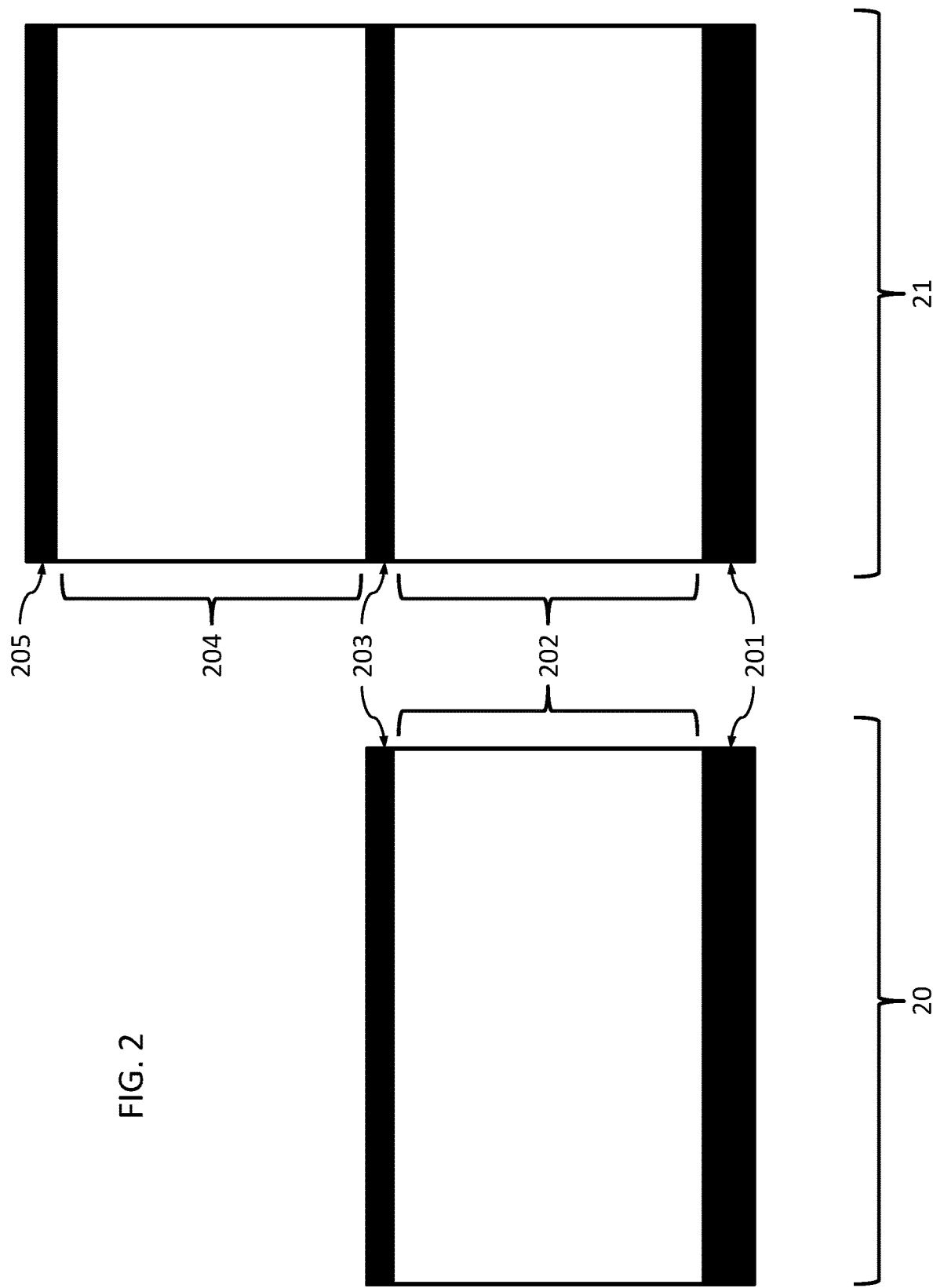
FIG. 2 is a drawing comparing a conventional layer structure for a light emitting device (left side) alongside an exemplary layer structure of a light-emitting device according to embodiments of the present invention (right side) including additional layers deposited on top of the conventional light emitting device.

FIG. 2 is a drawing comparing a conventional layer structure for a light emitting device 20 (left side) alongside an exemplary layer structure of a light-emitting device 21 (right side) according to embodiments of the present invention including additional layers deposited on top of the conventional light emitting device. The depiction of the conventional light-emitting device 20 in FIG. 2 essentially is a simplified depiction of the device illustrated in FIG. 1. The conventional layer stack of the light emitting device 20 includes a first reflective electrode 201 and a partially reflective second electrode 203. The reflective first electrode 201 may be the anode and the partially reflective second electrode 203 may be the cathode. Functional layers 202 are disposed between the first electrode 201 and second electrode 203, which include emissive layers, electron transport layers, and hole transport layers as previously detailed with respect to FIG. 1.

The layer structure of the enhanced light-emitting device 21 includes an additional transparent region 204 and an additional partially reflective layer 205 deposited on top of the second electrode 203 (e.g., cathode). In such a structure, by optimizing the thickness of the substantially transparent region 204, the partially reflective cathode 203 and partially reflective layer 205 can be moved to be located at nodes of the electromagnetic field generated by the recombination of electrons and holes in the emissive layer. In this way, the reflection presented by the functional layers to the generated light leaving the device is minimized, and the extraction of light out of the device is maximized. In particular, the light emitted in a particular direction, such as on-axis, can be maximized because the addition of the transparent region 204 and partially reflective layer 205 form a cavity effect, and the direction of light emission depends on the total path length seen by an emitted light ray.

A quantum dot light-emitting device (QLED) with such a layer structure provides at least the following significant advantages over conventional configurations:

1. The enhanced layer structure is deposited after the functional layers are formed, and thus can be used to optimize the extraction of the light emission and tune the emission profile after the functional layers are in place, allowing independent optimization of the electrical and optical properties of the light emitting device.
2. The absolute magnitude of extracted light generally stays the same when integrated over all angles, but the enhanced layer structure allows the extracted light to be redistributed to being mostly perpendicular to the layer stack (nominally on-axis). This angular redistribution is not possible except in a wave-optics regime (near-field), so additional light shaping, lensing and other processing of the layers in the far-field cannot achieve this effect.
3. The difference in total cavity thickness for a light emitting device is achieved without having to pattern the functional layers, and instead takes place by patterning (e.g. with selective etches or depositions) a robust transparent layer 204 such as $SiO_2$ or ITO. This is beneficial because the functional layers are generally very sensitive to chemical processes, so patterning processes on these layers can significantly impact device performance. The transparent layer, however, can be chosen to be robust to such a process and prevent damage to the functional layers on which the transparent layer is deposited.
4. The transparent layer 204 may additionally have the function of being a barrier to moisture and/or oxygen ingress, thereby providing protection of the QLED from damage by moisture or oxygen and thereby improving the lifetime of the QLED in addition to the beneficial effects related to extraction of light.

Figure 3:
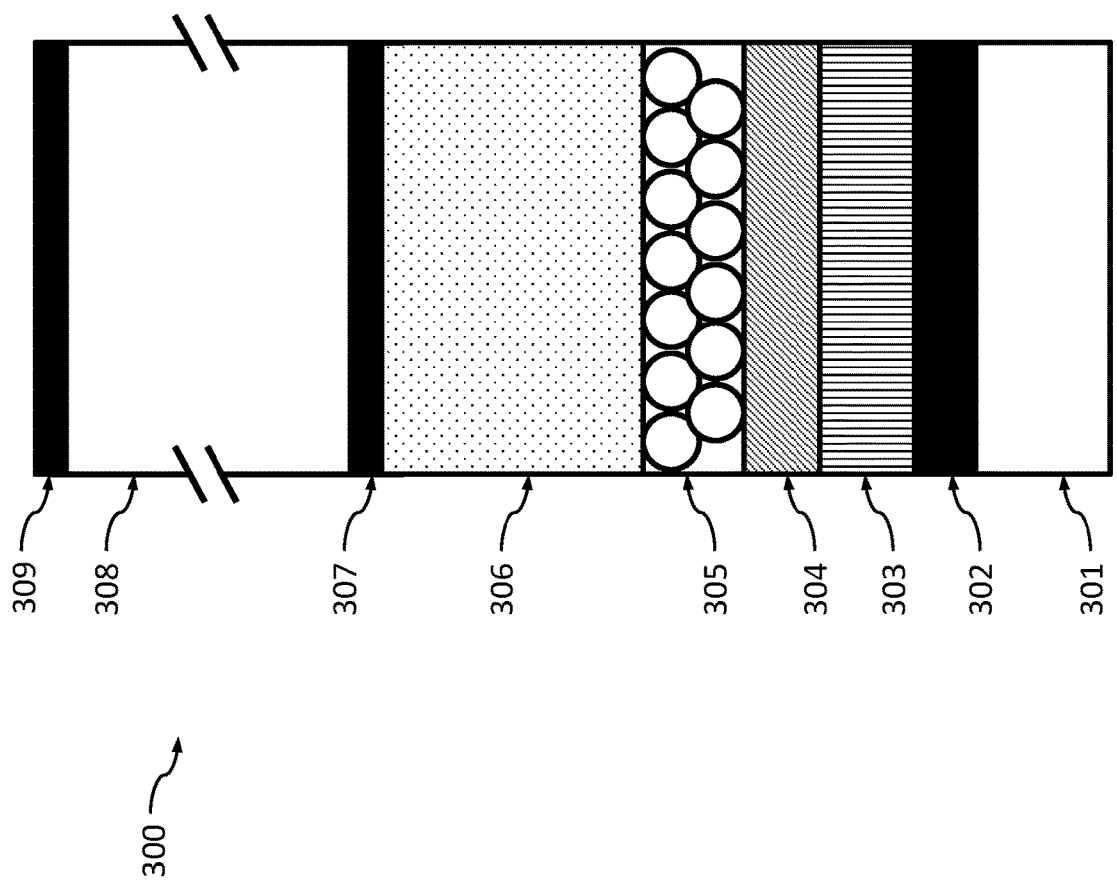
FIG. 3 is a drawing depicting a light-emitting device having an enhanced layer structure in accordance with embodiments of the present invention.

FIG. 3 is a drawing depicting a light-emitting device 300 having an enhanced layer structure in accordance with embodiments of the present invention. FIG. 3 details the individual electrode and functional layers of the light emitting device, and the individual layers can be successively fabricated as known in the art by either solution processing methods, such as but not limited to spin-coating, inkjet printing, or slot die coating, or evaporative methods such as but not limited to sputtering, thermal evaporation or electron beam evaporation. The individual layers of the light-emitting device 300 may include the following from a non-emitting side:

a substrate such as glass (301);
a first electrode layer that acts as a rear reflector such as silver (302);
a hole injection layer such as poly(3,4-ethylenedioxythiophene) polystyrene sulfonate (PEDOT:PSS) (303);
a hole transport layer such as Poly(9,9-dioctylfluorene-alt-N-(4-sec-butylphenyl)-diphenylamine) (TFB) (304);
an emissive layer, such as a quantum dot layer such as CdSe/ZnS (305);
an electron transport layer such as ZnO (306);
a second electrode layer that is a thin semi-transparent or partially reflecting layer such as silver (307);
an optically transparent layer such as $SiO_2$ or ITO depending on whether it is desirable for the optically transparent layer to be conductive or insulating (308); and
and a thin semi-transparent or partially reflecting layer such as silver (309).

It will be appreciated that other suitable materials may be employed for the various layers so long as the referenced properties are achieved. It is desirable for the optically transparent layer to be conducting if the top layer 309 is used as the contacting electrode. Furthermore, advantageously, if the optically transparent layer is conducting, the voltage applied to the second electrode may be conducted through this layer. This may be an advantage because the second electrode layer is a relatively thick layer, so there may be less electrical resistance for flow of electrical current parallel to the plane of the layer in such layer. For simplicity, in contrast the optically transparent layer 308 alternatively may be insulating.

In the exemplary layer structure of FIG. 3, the optically transparent layer 308 is selected to be of a thickness specifically selected to optimize the light extracted from the light emitting device of a given wavelength emitting region of the device, such as red, green, or blue light. This thickness of the optically transparent layer 308 is chosen with reference to given thicknesses of the functional layers 303-306 to minimize the magnitude of the electromagnetic field present in the partially reflective layers 307 and 309, thereby enhancing the on-axis light extraction perpendicular to the device layers.

Figure 4:
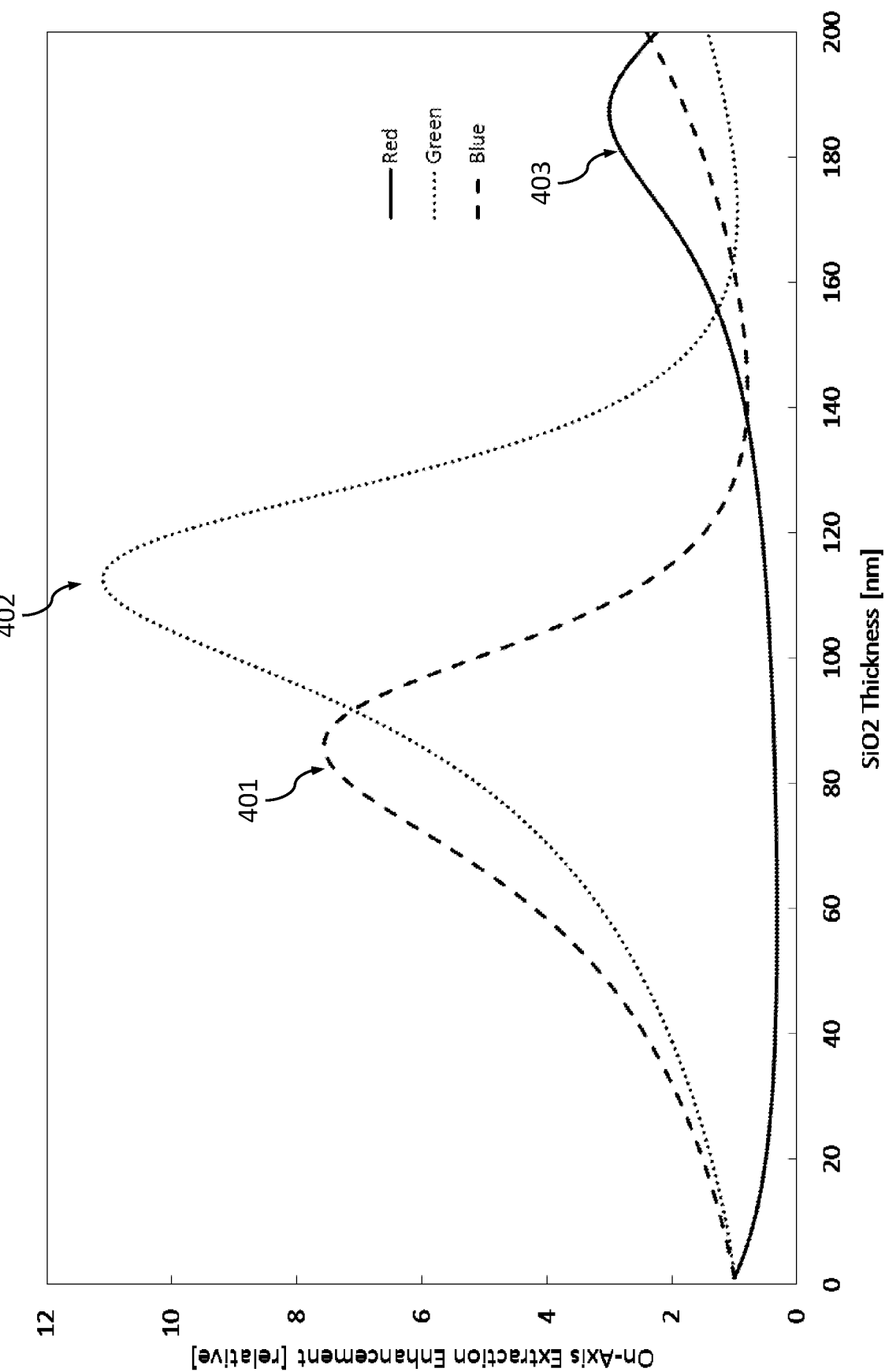
FIG. 4 is a graph depicting the enhancement of the extraction of light perpendicular to the layer structure (nominally "on-axis") using a layer structure comparable to that of FIG. 3.

FIG. 4 is a graph depicting the enhancement of the extraction of light perpendicular to the layer structure (nominally "on-axis") using a layer structure comparable to that of FIG. 3. Accordingly, FIG. 4 shows the relative enhancement of the extraction of light emitted perpendicular to the layer stack (on-axis) when the optically transparent layer 308 is present and of a certain thickness, compared to when the optically transparent layer 308 is not present. In this example, the optically transparent layer is formed of SiO2, and the enhancement is shown as a function of $SiO_2$ thickness and for three different wavelengths of light, including red (630 nm), green (520 nm), and blue (470 nm) light. In each of red, green, and blue light emission, the overall structure of the light-emitting device is comparable, but with a different type of quantum dot in the emissive layer to generate the different wavelengths of emission from different regions of the device. In this example, FIG. 4 uses the following thicknesses and materials for the functional layers (which may be deposited on a glass substrate such as layer 301 of FIG. 3):
100 nm Silver (302);
48 nm PEDOT:PSS (303);
33 nm TFB (304);
20 nm CdSe/ZnS QDs (305);
40 nm ZnO (306);
8 nm Silver (307);
A variable thickness of $SiO_2$ between 0-200 nm (308); and
8 nm Silver (309).

Lines 401, 402, and 403 in FIG. 4 show the enhancement of the on-axis emission as a function of transparent layer thickness for emission of blue 401, green 402, and red 403 light respectively. The enhancement is up to a factor of eleven times greater light intensity on-axis with the addition of the transparent layer and additional top reflector for the case of green light. The enhancement for these particular layer thicknesses are lower for red light 403 (factor of three times enhancement) and blue light 401 (factor of seven times enhancement), but the relative enhancements can be varied by altering the total thickness of the functional layers, for example by changing the electron transport layer thickness to be non-uniform for the different wavelength emissions. More specifically, this example includes an electron transport layer (ETL) 306 of 40 nm ZnO, which when uniform across the device has maximum enhancement for green light with enhancement at a reduced level for red and blue light. Alternatively, a 30 nm ZnO uniform ETL may be used to maximize enhancement of blue light emission as compared to red and green light emission, or a 60 nm ZnO uniform ETL may be used to maximize enhancement of red light emission as compared to green and blue light emission.

Figure 5:
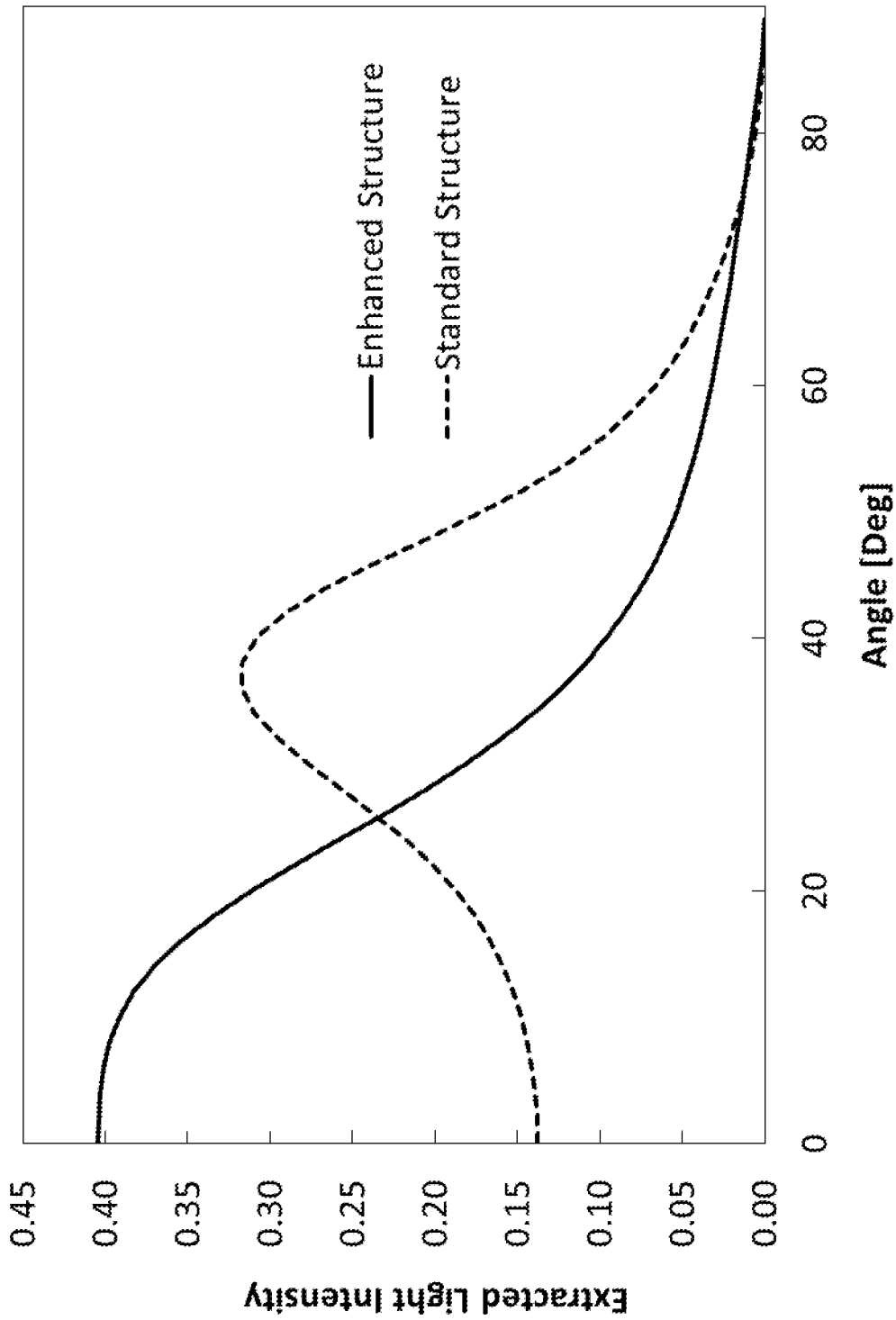
FIG. 5 is a graph depicting the angular dependence of the light emission of the light emitting device using a layer structure as described with respect to FIGS. 3 and 4 as compared to the light emission of a conventional light emitting device.

FIG. 5 is a graph depicting the angular dependence of the light emission of a light-emitting device using an enhanced layer structure comparably as described with respect to FIGS. 3 and 4 as compared to the light emission of a conventional or standard light emitting device structure. FIG. 5 in particular depicts the angular profile of emission for the light-emitting device for red light emission, with and without an optimized thickness of a transparent layer. A comparable effect is observed for both green and blue light at the optimized thickness of the transparent layer as indicated in FIG. 4 (about 187 nm for red light, about 113 nm for green light, and about 86 nm for blue light).

FIG. 5 shows that the additional transparent layer 308 and partial reflector 309 act to change the angular profile of emitted light. For the standard structure having no additional transparent layer 308 and partial reflector 309, substantial light is emitted off-axis at approximately 40 degrees to normal. Adding an optimized thickness (187 nm for red light from FIG. 4) transparent layer of $SiO_2$ shifts the emission to being more focused on-axis, effectively enhancing the on-axis emission by a factor of three. Again, a comparable effect is observed for both green and blue light at the optimized thickness of transparent layer as indicated in FIG. 4 for the green and blue wavelengths. The additional transparent layer 308 and partial reflector 309 may be patterned so that a first set of color pixels yields the enhanced angular profile of FIG. 5, and a second set of color pixels, different from the first set, yields the conventional angular profile of FIG. 5. As further detailed below, such patterning may be employed to permit different angular viewing modes, such as for example a privacy viewing mode requiring a strong on-axis viewing zone with reduced emission off-axis, and a public viewing mode requiring substantial off-axis emission that permits a wider viewing angle.

As an alternative to a more uniform layer structure for a light-emitting device as described above with respect to FIGS. 3 and 4, in which the green light emission is most optimized, a more individualized enhancement for each of red, green, and blue light emission may be performed by adjusting the transparent layer thickness for each of a plurality of regions of different color emission. An aspect of the invention, therefore, is an enhanced light-emitting device that has enhanced directional light emission, and enhanced on-axis light emission in particular. In exemplary embodiments, a light-emitting device comprises a layer structure that includes from a non-emitting side: a first electrode layer; a first charge transport layer; an emissive layer; a second charge transport layer; a second electrode layer; an optically transparent layer; and a partially transmitting reflector layer. The light-emitting device comprises a plurality of regions and each region emits light of a different wavelength, such as for example red, green, and blue light-emitting regions. The optically transparent layer is present in at least one of the plurality of regions. The optically transparent layer may be present in more than one of the plurality of regions, and a thickness of the optically transparent layer differs in at least two of the plurality of regions, and/or the optically transparent layer may be present in each of the plurality of regions, and a thickness of the optically transparent layer differs in each of the plurality of regions.

Figure 6:
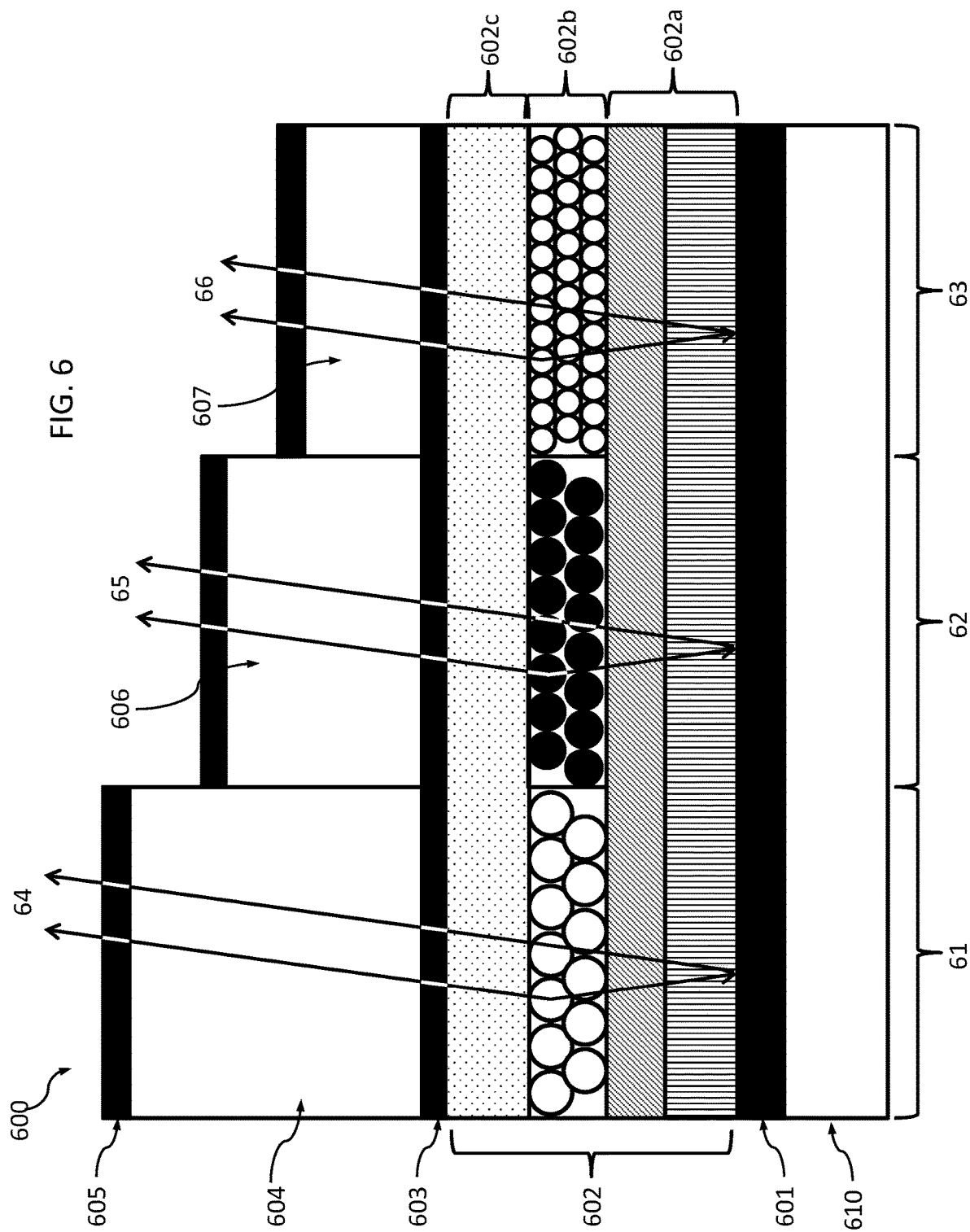
FIG. 6 is a drawing depicting an exemplary light-emitting device in accordance with embodiments of the present invention having a layer structure optimized for red, green, and blue light emission.

In accordance with such features, FIG. 6 is a drawing depicting an exemplary light-emitting device 600 in accordance with embodiments of the present invention having a layer structure optimized for red, green, and blue light emission. The example of FIG. 6 illustrates how varying the thickness of the optically transparent layer can compensate for using identical thicknesses for all of the active functional layers of a light emitting device.

FIG. 6 illustrates a layered structure including a red emission region 61, a green emission region 62, and a blue emission region 63. The different color emission regions 61, 62, and 63 may correspond to different pixels or sub-pixels. The light emitting device may include a layer structure deposited on a glass substrate 610, including from a non-emitting side a first electrode layer 601, functional layers 602 (including hole injection and transport layers 602a, emissive layers 602b, and an electron transport layer 602c), and a second electrode layer 603. In exemplary embodiments, the first electrode layer 601 is the anode and the second electrode layer 603 is the cathode. The emissive layers for the different color regions are denoted by the different filler representations in the emissive layers 602b, whereby differences in quantum dot composition within the emissive layers result in the different colors of light emission. At least one of the first electrode layer 601 and the second electrode layer 603 may be divided such that an electrical bias may be applied independently to the different regions 61, 62, 62. In an exemplary embodiment, the first electrode layer 601 is divided between regions 61, 62 and 63, and the second electrode layer 603 is not divided between these regions. The regions 61, 62 and 63 may be electrically isolated from one another such that there is an electrically insulating barrier that interrupts the layers 602a, 602b and 602c in between regions 61, 62 and 63.

Optically transparent layers of different thickness are deposited on the second electrode layer 603. In particular, in red light emission region 61 a transparent layer 604 of greatest thickness is deposited on the second electrode layer 603; in green light emission region 62 a transparent layer 606 of intermediate thickness is deposited on the second electrode layer 603; and in blue light emission region 63 a transparent layer 607 of least thickness is deposited on the second electrode layer 603. A partially reflective layer 605 is deposited on each of the transparent layers 604, 606, and 607. The thickness optically transparent layers 604, 606, and 607 is different for each of the pixels red 61, green 62, and blue 63 to optimize the microcavity effect and enhance the extraction of light of a given wavelength. For such optimization, the blue pixel 63 has the thinnest optically transparent layer 604, since blue light 66 has the shortest wavelength. Correspondingly, the red pixel 61 has the thickest optically transparent layer 604 since red light 64 has the longest wavelength, and the thickness of optically transparent layer 606 of the green pixel 62 is intermediate between thicknesses of layers 603 and 607 as the green light 65 has an intermediate wavelength between that of red light 64 and blue light 66.

In the example of FIG. 6, the thicknesses of the functional layers 601-603 are the same for each of the red 61, green 62 and blue 63 emission regions, but the thicknesses of the transparent layers 604, 606 and 607 are individually selected for optimal on-axis light extraction corresponding for the functional layer thicknesses of each color region. With reference to FIG. 4, for example, in an exemplary embodiment the transparent layer thicknesses would be 187 nm for the red pixel 61, 113 nm for the green pixel 62, and 86 nm for the blue pixel 63. This individual selection of layer thickness can be achieved by either three successive depositions of an optically transparent material, for example $SiO_2$ or ITO, or a single deposition carried out through a shadow mask in which the pixel window is incrementally closed during the evaporation process. The different thicknesses can also be achieved by carrying out a single $SiO_2$ or ITO deposition followed by selectively etching the red, green or blue regions to result in the desired thickness. As referenced above, processing the optically transparent layer is far simpler than selectively etching or patterning the functional layers, since $SiO_2$, ITO and similar suitable materials that may be used for the transparent layer are known to be robust to such processing and provide good protection to the functional layers beneath, whereas organic functional layers are generally very sensitive to chemical processes.

Advantages of the invention may be obtained if the layer 602a in regions 61, 62, and 63 are not all the same material or all the same thickness. Similarly, advantages of the invention may be obtained if the layer 602c in regions 61, 62 and 63 are not all the same material or all the same thickness. For example, the material for layer 602a or 602c may be selected to provide suitable injection of electrical charge into the emissive region 602b in the regions 61, 62 and 63.

Figure 7:
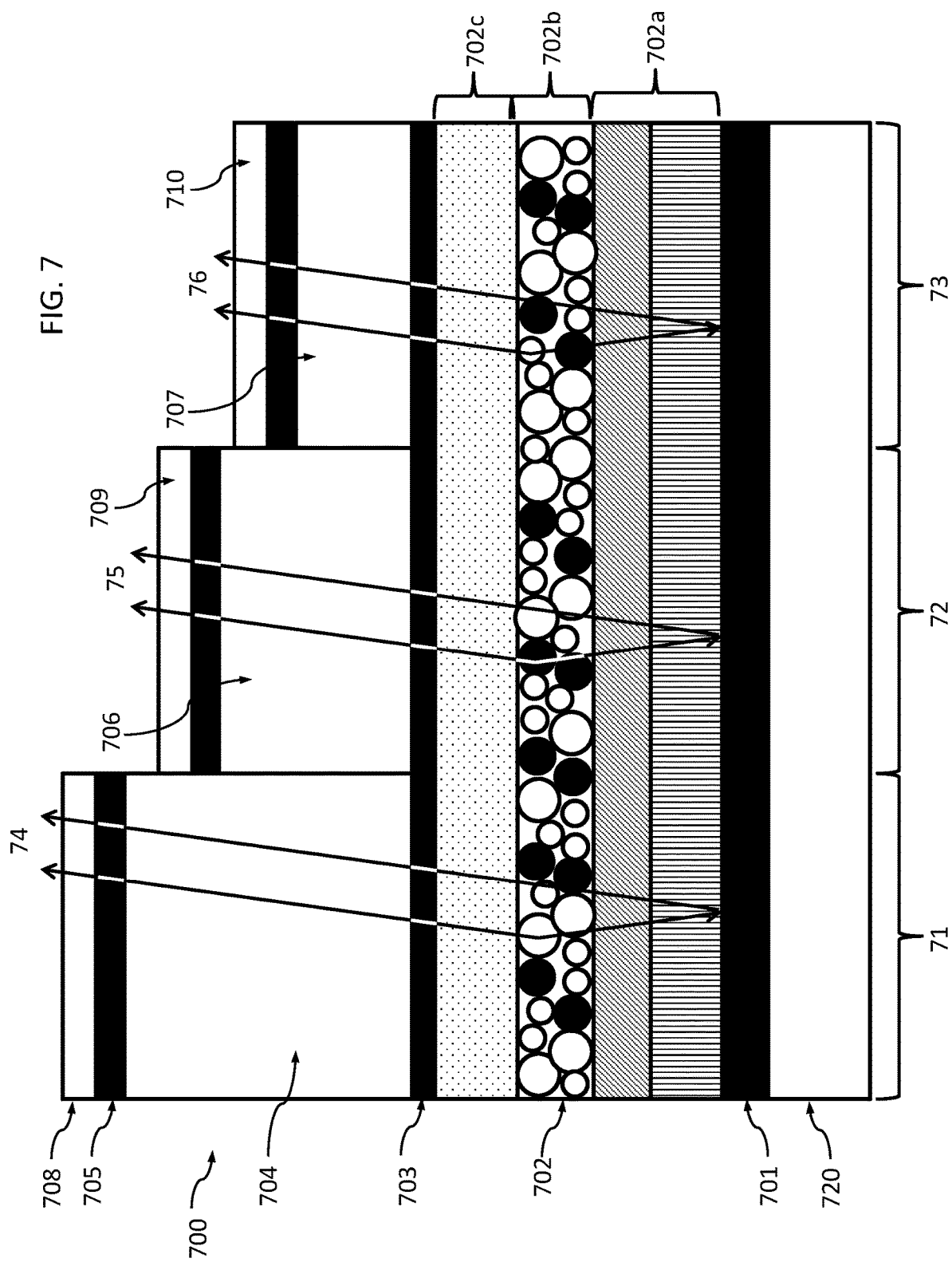
FIG. 7 is a drawing depicting another exemplary light-emitting device in accordance with embodiments of the present invention having a layer structure including an emissive layer containing a mixture of red, green, and blue quantum dots.

FIG. 7 is a drawing depicting another exemplary light-emitting device 700 in accordance with embodiments of the present invention having a layer structure also optimized for red, green, and blue light emission. The example of FIG. 7 also illustrates how varying the thickness of the optically transparent layer can compensate for using identical thicknesses for all of the active functional layers of a light emitting device. In the example of FIG. 7, an optically transparent layer can transmit substantially light emitted from a light-emitting device with an emissive layer containing a mixture of quantum dots which emit light including wavelengths corresponding to red, green, and blue light. Color filter layers then may be employed to limit the emission towards the viewer of the light emitted from the quantum dots to specific colors in corresponding different color regions (e.g., pixels or sub-pixels).

In accordance with such features, FIG. 7 illustrates a layered structure including a red emission region 71, a green emission region 72, and a blue emission region 73. The different color regions 71, 72, and 73 may correspond to different pixels or sub-pixels. The light emitting device may include a layer structure deposited on a glass substrate 720, including from a non-emitting side a first electrode layer 701, functional layers 702 (including hole injection and transport layers 702a, an emissive layer 702b, and an electron transport layer 702c), and a second electrode layer 703. In exemplary embodiments, the first electrode layer 701 is the anode and the second electrode layer 703 is the cathode. As referenced above, in this example the light emitted from the emissive layer has substantially the same mixture of red, green and blue light in all regions 71, 72 and 73 owing to the emissive layer containing a mixture of quantum dots that emit wavelengths corresponding to red, green, and blue light (denoted by the different particle size representations in the emissive layer 702b).

Optically transparent layers of different thickness are deposited on the second electrode layer 703. In particular, similarly as in the previous embodiment in red light emission region 71 a transparent layer 704 of greatest thickness is deposited on the second electrode layer 703; in green light emission region 72 a transparent layer 706 of intermediate thickness is deposited on the second electrode layer 703; and in blue light emission region 73 a transparent layer 707 of least thickness is deposited on the second electrode layer 703. A partially reflective layer 705 is deposited on each of the transparent layers 704, 706, and 707. In this example, because the emissive layer emits light with substantially the same mixture of red, green and blue light in all regions 71, 72 and 73, additional color filter layers 708 (red), 709 (green), and 710 (blue) may be deposited on top of each region to remove any light of other colors other than the intended color for a given region (e.g., pixel or sub-pixel). The color filter layers 708, 709, and 710 may be absorbing color filter layers and/or may be reflective color filter layers. This embodiment reduces overall display efficiency by filtering light of different colors from respective color regions, but significantly eases the manufacturability of the light-emitting device by having common emissive and charge transport layers that span the color regions.

Similarly as in the previous embodiment, in the example of FIG. 7 the thicknesses of the functional layers 701-703 are the same for each of the red 71, green 72, and blue 73 emission regions, but the thicknesses of the transparent layers 704, 706 and 707 are individually selected for optimal on-axis light extraction corresponding for the functional layers of each color region. Again with reference to FIG. 4, for example, in an exemplary embodiment the transparent layer thicknesses may be 187 nm for the red pixel 71, 113 nm for the green pixel 72, and 86 nm for the blue pixel 73. This individual selection of layer thickness again can be achieved any suitable processing of the optically transparent material, for example $SiO_2$ or ITO. As referenced above, processing the optically transparent layer is far simpler than selectively etching or patterning the functional layers, since $SiO_2$, ITO and similar suitable transparent materials are known to be robust to such processing and provide good protection to the functional layers beneath, whereas organic functional layers are generally very sensitive to chemical processes.

Figure 8:
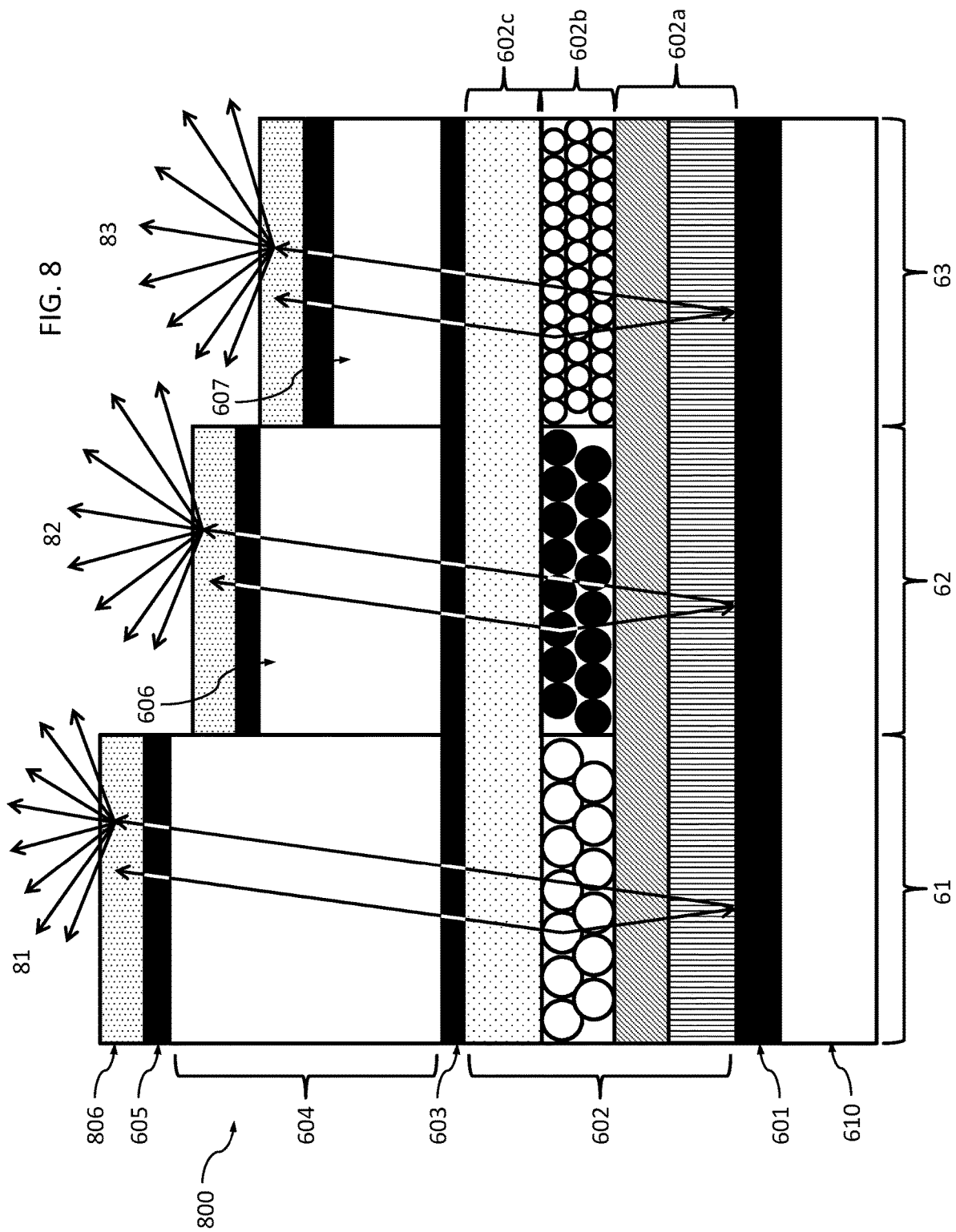
FIG. 8 is a drawing depicting an exemplary light-emitting device having a layer structure comparable to that of FIG. 6, with an additional top scattering layer acting to scatter the emitted light.

FIG. 8 is a drawing depicting an exemplary light-emitting device 800 having a layer structure comparable to that of FIG. 6, with an additional top scattering layer 806 acting to scatter the emitted light. Accordingly, like components are identified with like references numerals as in FIG. 6, and like components act comparably in both embodiments. In the example of FIG. 8, the scattering layer 806 operates to scatter red light into scattered red light 81 emitted from red emission region 61, operates to scatter green light into scattered green light 82 emitted from green emission region 62, and operates to scatter blue light into scattered blue light 83 emitted from blue emission region 83. The addition of the scattering layer 806 at the top of each pixel renders the emission profile substantially lambertian and identical for each pixel, rather than with strong emission only on-axis. The scattering layer 806 may be configured for emission profiles other than substantially lambertian, depending on the optimum emission profile desired for a given application. This results in a display which shows no change in color with viewing angle, which is often a problem with emissive displays, in which the emission profile for red, green, and blue are generally substantially different. Advantageously, the combination of the transparent layer 604 and the scattering layer 806 may provide light emission with both high efficiency and of a desired angular distribution. This is achieved because the transparent layer 604 may be configured such that the total fraction of light emitted from the emissive layer 602b, which propagates into the scattering layer 806, is high or maximized (i.e. the optical extraction efficiency is high or maximized), and then the scattering layer 806 may be configured to provide scattered light with a desired angular distribution. The scattering layer 806 may be a diffractive element. The diffractive element may be a surface relief grating (surface topology provides diffraction) and/or a phase grating. The diffraction grating may be fabricated using a conventional fabrication method such as printing or photolithography.

Described below in various embodiments is a light emitting display device that can be switched between a first viewing angle response (such as a narrow angle viewing mode or private viewing mode) and a second viewing angle response (such as a wide angle viewing mode or public viewing mode). A summary of the switchable viewing angle embodiments follows:

i) A patterned optically transparent layer and a patterned partially transmitting reflector layer may be used to realize a first set of pixels and/or sub-pixels with first angular dependent profile and second set of pixels and/or sub-pixels with second angular dependent profile. The first and second angular dependent profiles are different. Switching between the first and second angular dependent profiles is controlled by how images are generated by the image control unit.

ii) A patterned non-switchable scattering layer is used to realize a first set of pixels and/or sub-pixels with first angular dependent profile and second set of pixels and/or sub-pixels with second angular dependent profile. The first and second angular dependent profiles are different. Switching between the first and second angular dependent profiles is controlled by how images are generated by the image control unit.

iii) A non-patterned switchable scattering layer is used to enable all pixels and/or sub-pixels to have first angular dependent profile when the switchable scattering layer is in a first state and all pixels and/or sub-pixels to have a second angular dependent profile when the switchable scattering layer is in a second state. The first and second angular dependent profiles are different. Switching between the first and second angular dependent profiles is controlled by the switchable scattering layer only.

iv) A patterned switchable scattering layer is used to enable a first set of pixels and/or sub-pixels with first angular dependent profile and second set of pixels and/or sub-pixels with second angular dependent profile. The first and second angular dependent profiles are different. Switching between the first and second angular dependent profiles is controlled by how images are generated by the image control unit and/or by the switchable scattering layer.

In a broader display device including an array of light-emitting devices according to any of the embodiments, the scattering layer 806 may be patterned so that there is at least a first set color regions such as sub-pixels (i.e. color pixels) or pixels (i.e. a combination of color pixels that form a white pixel) that have a scattering layer 806, and at least a second set of color regions such as sub-pixels or pixels that are different from the first set, that do not have a scattering layer 806. Alternatively, the scattering layer 806 may be patterned so that there is at least a first set of color regions that have a first type of scattering layer 806, and at least a second set of color regions that is different from the first set that has a second type of scattering layer 806 that is different from the first type of scattering layer. For example, when a first set of sub-pixels has a scattering layer, the scattering layer for each sub-pixel within the first set may be different to account for the different wavelength range emitted by each sub-pixel. When a second set of sub-pixels has a scattering layer, the scattering layer for each sub-pixel within the second set may be different to account for the different wavelength range emitted by each sub-pixel. The first and/or the second scattering layers may be diffractive. The first and/or the second scattering layers may scatter light in a lambertian fashion, and/or the second scattering layer may scatter light as a function of viewing angle. The scattering layer further may be switchable between a scattering mode that scatters light and a non-scattering mode that does not scatter light to permit different viewing angle display modes, as further detailed below.

In general, the scattering layer may be patterned so that the first set of color regions (e.g., sub-pixels or pixels) have a first type of luminance against viewing angle response, and the second set of color regions (e.g., sub-pixels or pixels) has a second type of luminance against viewing angle response, wherein the first and second luminance against viewing angle responses are different from one another. The scattering layer 806 may be patterned on a sub-pixel scale (i.e., each color pixel 61, 62 and 63 may or may not have a scattering layer), or the scattering layer 806 may be patterned on a pixel scale (i.e., each white pixel comprised of 61+62+63 color sub-pixels may or may not have a scattering layer). The scattering layer 806 also may be patterned on a scale comprising several white pixels (i.e., adjacent groups of several white pixels each comprised of 61+62+63 color sub-pixels may or may not have a scattering layer). The scattering layer 806 also may be patterned in a stripe pattern or a chequerboard pattern.

FIG. 9 is a drawing depicting a plan view of a light-emitting device array 1005 including an array of light-emitting devices that correspond to pixels or sub-pixels that may be incorporated into an exemplary OLED or QLED display device. FIG. 9 illustrates an example using a patterned scattering layer, which may be employed with the layer structure illustrated in FIG. 8. The particular example of FIG. 9 shows a plan view of the scattering layer patterned on the color pixel (or sub-pixel) scale in a chequerboard arrangement. With reference to FIG. 9, the color pixels 81a, 82a, and 83a correspond to red, green, and blue pixels or sub-pixels respectively having a first scattering function (i.e., first scattering function is denoted by the "a" indication). The color pixels 81b, 82b, and 83b correspond to red, green, and blue pixels or sub-pixels respectively having a second scattering function different from the first scattering function (i.e., second scattering function is denoted by the "b" indication). As detailed above, other patterning arrangements of the scattering layer 806 may be realized. In general, the color pixels 81a, 82a, and 83a correspond to red, green, and blue pixels or sub-pixels respectively having a first angular dependent luminance profile and the color pixels 81b, 82b, and 83b correspond to red, green, and blue pixels or sub-pixels respectively having a second angular dependent luminance profile that is different to the first angular dependent luminance profile.

In the depiction of FIG. 9, the pixel array represents a small spatial region of a broader OLED or QLED display device area. By patterning the scattering layer 806, the viewing angle of the OLED or QLED display will depend upon how an image is processed via an image control unit. In one example, the first set of color pixels (81a, 82a, 83a) have a scattering layer that scatters light in a lambertian fashion (i.e., the first set of pixels scatter light into a wide angle that can be observed even at high angles of incidence). In addition, the second set of color pixels (81b, 82b, 83b) do not have a scattering layer and therefore the majority of light from these pixels is emitted on-axis (i.e., the second set of pixels do not scatter light and therefore only a small amount of light observed for a range of off-axis angles) as described above with respect to the light-emitting device structures.

A light-emitting device array may be incorporated into a display system including an array of light-emitting devices according to any of the embodiments, and an image control unit configured to receive an input image and drive the array of light-emitting devices to generate an output image. In exemplary embodiments, the scattering layer for each of a plurality of regions may be switchable between a scattering mode and a non-scattering mode to enable generation of multiple different patterns of the scattering layer. When the light-emitting devices of the display system include a switchable scattering layer, the image control unit may be configured to pattern the scattering layer so that a first set of regions of the plurality of regions has a first type of luminance against viewing angle response, and a second set of regions of the plurality of regions has a second type of luminance against viewing angle response, and wherein the first and second luminance against viewing angle responses are different from each other. Alternatively, the scattering layer for all regions may be switchable between a scattering mode and a non-scattering mode whereby the every pixel or sub-pixel pertaining to the image display is either scattered (i.e. the non-patterned switchable scattering layer is switched into the scattering mode) or not scattered (i.e. the non-patterned switchable scattering layer is switched into the non-scattering mode).

For example, the first luminance against viewing angle response may be a narrow viewing angle mode and the second luminance against viewing angle response may be a wide viewing angle viewing mode relative to the narrow viewing angle mode. The display system further may include a memory device that stores a look-up table that corresponds to a plurality of scattering layer patterns, and the image control unit is configured to obtain the predetermined pattern from the look-up table from among the plurality of scattering layer patterns.

Figure 10:
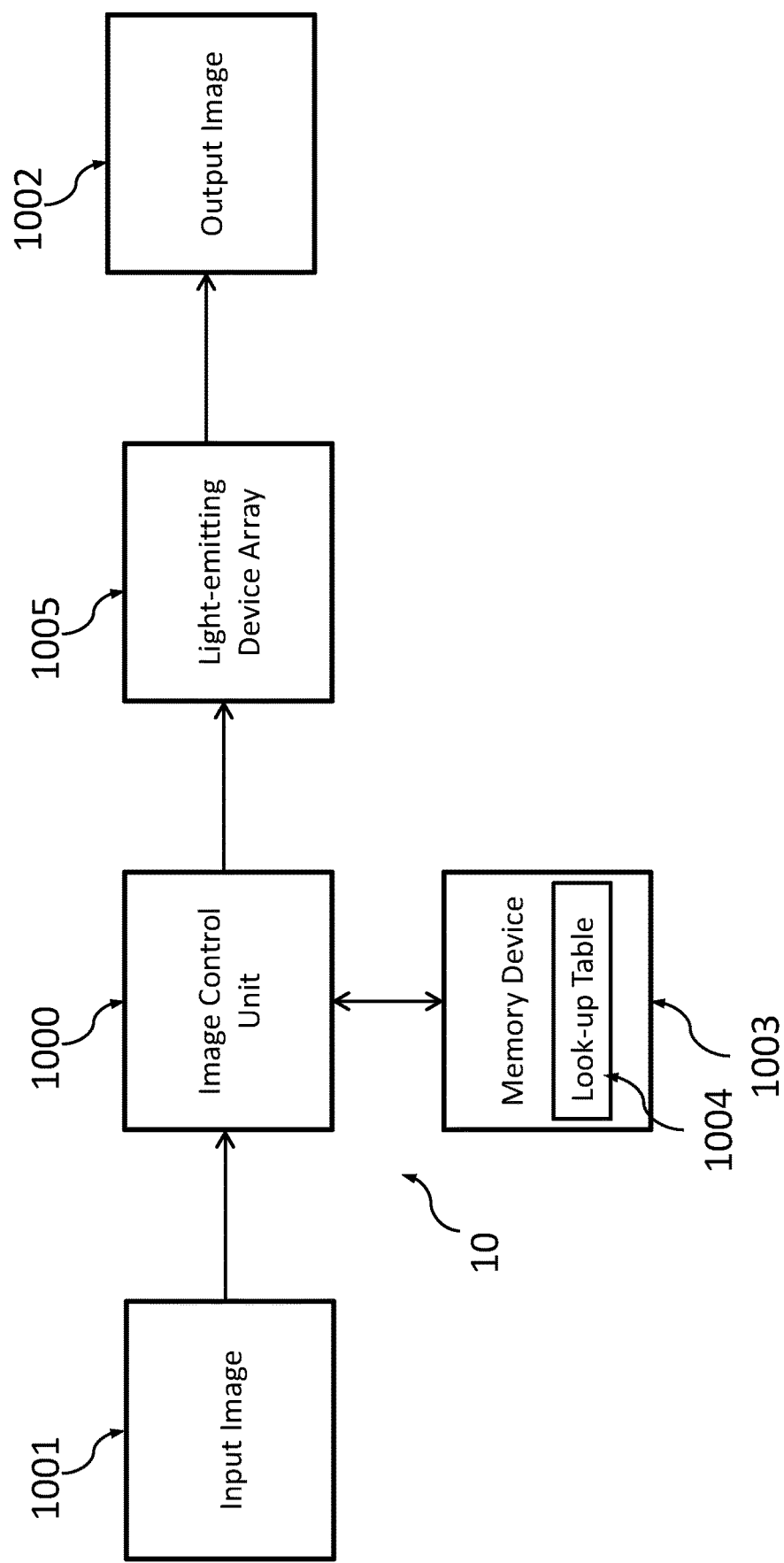
FIG. 10 is a block diagram depicting an exemplary display system in accordance with embodiments of the present invention.

In accordance with such features, FIG. 10 is a block diagram depicting an exemplary display system 10 in accordance with embodiments of the present invention, which includes an image control unit 1000, a memory device 1003 that may store a look-up table 1004, and an array of light-emitting devices 1005. The array of light-emitting devices 1005 may include a plurality of red, green, and blue (RGB) light-emitting devices in accordance with any of the embodiments. As further detailed below, the image control unit 1000 is configured to receive an input image 1001 that is derived from input image data. The image control unit 1000 in turn generates output image data that drives the light-emitting device array 1005 to generate an output image 1002.

With reference to FIG. 9 in combination with FIG. 10, when an image is desired that does not vary with viewing angle (for example, a public view mode), then the image control unit 1000 can be used to modify a conventional input image 1001 so that the output image 1002 is addressed only to the first set of pixels or regions in the light-emitting device array 1005 that has the scattering layer. When an image is desired that does vary with viewing angle (for example, a private view mode for primarily on-axis viewing and/or a low power mode), then the image control unit 1000 can be used to modify an input image 1001 so that the output image 1002 is addressed only to the second set of pixels or regions of the light-emitting device array 1005 lacking the scattering layer for a more concentrated on-axis emission. When an image is desired that has maximum on-axis brightness, then the image control unit 1000 can be used to modify an input image 1001 so that the output image 1002 is addressed to both the first and second sets of pixels or regions of the light-emitting device array 1005 for maximum emission. Various combinations of the above also may be employed. For example, when an image is desired that has a first spatial region that does not vary with viewing angle and a second spatial region, different from the first spatial region, that does vary with viewing angle, the image control unit 1000 can selectively modify an input image 1001 and generate an output image 1002 to drive the light-emitting device array 1005 to achieve the spatial variations across the display device.

For the image control unit 1000 to operate in accordance with the control methods above, the image control unit 1000 is pre-programmed with the precise patterning details of the scattering layer 806 so that the correspondence of each sub-pixel or pixel region of the first and second sets is known for each display mode. The image control unit 1000 may access patterning details of the scattering layer from a look up table (LUT) 1004 that is stored in a memory device 1003. The memory device 1003 may be any suitable non-transitory computer readable medium that stores electronic data, such as a hard drive, flash drive, RAM memory, or other suitable computer memory device. The image control unit 1000 is operatively coupled to the first and second sets of sub-pixels or pixels, wherein the image control unit is configured to drive each of the sets of sub-pixel or pixel regions. The image control unit may drive each of the sets of sub-pixel or pixels such that on average the sets of sub-pixels or pixels simultaneously provide a predetermined on-axis luminance and a predetermined off-axis luminance for a region of the outputted image.

As a further example and with reference to FIGS. 2, 3, 5, 6, 7, 8 and 9, the additional transparent layer (204, 308, 604, 606, 607, 704, 706 and 707) and corresponding reflector layer (205, 309, 605 and 708) may be patterned so that a first set of color pixels or pixels (81a, 82a, 83a) in the light-emitting device array 1005 may have an enhanced angular dependent profile as depicted for the enhanced structure of FIG. 5, and a second set of color pixels or pixels (81b, 82b, 83b) that is different from the first set yields the standard angular dependent profile as depicted for the standard structure of FIG. 5. In such variation as well, the image control unit 1000 may be used in conjunction with a look up table 1004 to modify an input image 1001 so that the image is outputted to the first and/or second sets of color pixel or pixel regions in a predetermined pattern to achieve the desired viewing angle response from the display device. If a wide viewing angle response is required, the image control unit 1000 may be used in conjunction with a look up table 1004 to modify an input image 1001 so that only the first set of color pixels (81a, 82a, 83a) and/or the second set of color pixels (81b, 82b, 83b) are addressed. If a narrow viewing angle response is required, the image control unit 1000 may be used in conjunction with a look up table 1004 to modify an input image 1001 so that only the first set of color pixels (81a, 82a, 83a) are addressed. Alternatively, if a narrow viewing angle response is required, the image control unit 1000 may be used in conjunction with a look up table 1004 to modify an input image 1001 so that both the first set of color pixels (81a, 82a, 83a) and the second set of color pixels (81b, 82b, 83b) are addressed. The image processing function performed by the image control unit may be different for the wide view mode, the narrow view mode and the alternative narrow viewing mode.

In exemplary embodiments, the scattering layer, such as the scattering layer 806, may be a switchable scattering layer to achieve the control of patterning described above, in which the scattering layer in each region (e.g., pixel or -sub-pixel) can be electro-actively changed between being a scattering mode and a transmissive mode to allow for either a private (narrow angle) or public (wide angle) viewing mode of the display. For example, the switchable scattering layer may be a switchable liquid crystal layer within a liquid crystal cell device (switchable LCD). Such a switchable liquid crystal cell is described in Applicant's co-pending application Ser. No. 15/981,022 filed on May 16, 2018, the contents of which are incorporated here by reference.

Figure 11:
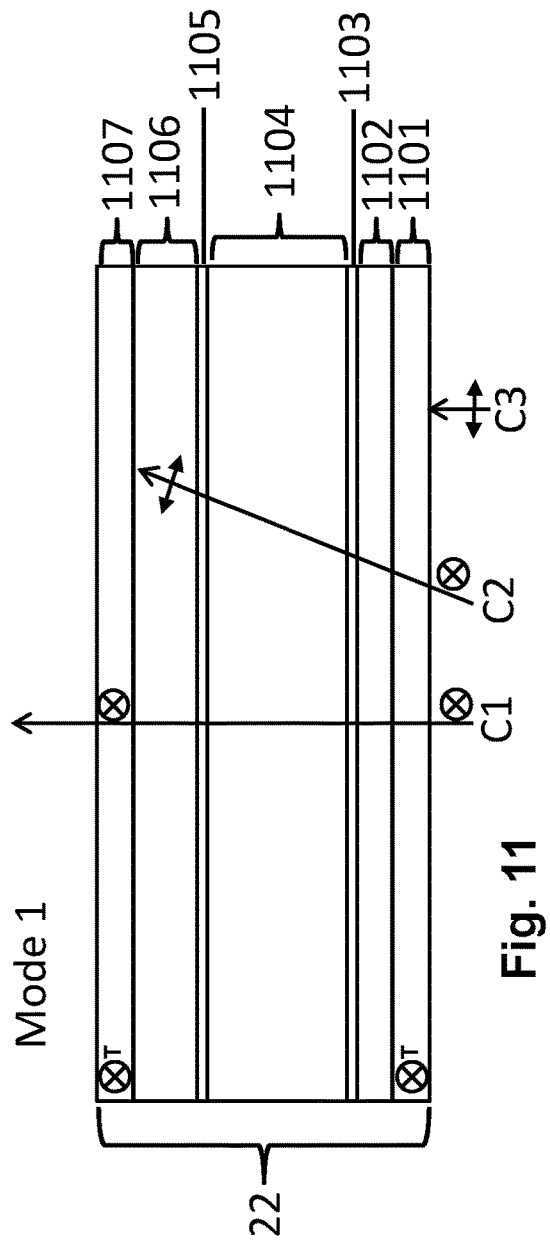
FIG. 11 is a schematic drawing depicting an exemplary view angle control LCD that may be used as a switchable scattering device, including optical performance in a narrow viewing angle mode.
Figure 12:
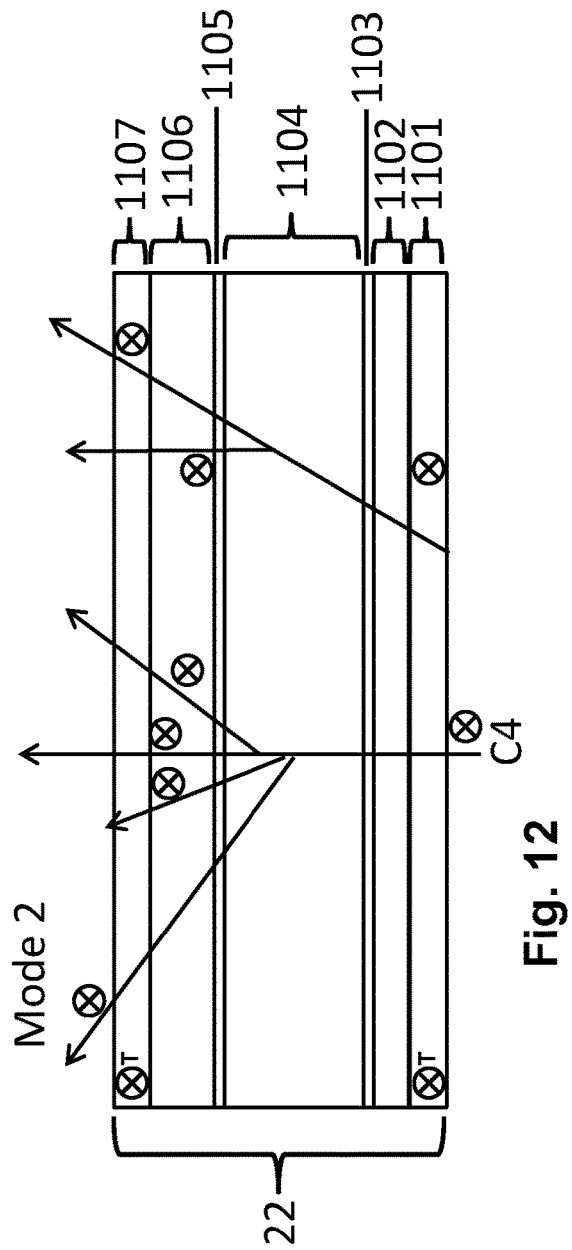
FIG. 12 is a schematic drawing depicting the exemplary view angle control LCD of FIG. 11 and showing optical performance in a wide viewing angle mode.

As an example of a switchable LCD scattering layer, FIG. 11 is a schematic drawing depicting an exemplary view angle control LCD 22 and showing optical performance in a narrow view angle mode (Mode 1). FIG. 12 is a schematic drawing depicting the exemplary viewing angle control LCD 22 of FIG. 11 and showing optical performance in a wide viewing angle mode (Mode 2). In general, the switchable view angle control LCD 22 may include the following components ordered from the viewing side as follows: a front polarizer 1107, a first electrode substrate 1106, a first LC alignment layer 1105, a switchable liquid crystal LC layer 1104, a second alignment layer 1103, a second electrode substrate 1102, and a rear polarizer 1101. In this example, the transmission axis of the polarizers (denoted "T") are of a first direction (e.g., into the page in the example drawing).

Referring to FIG. 11 and Mode 1 (narrow angle view), exemplary polarized light beams C1 and C2 are emitted from the non-viewing side components comprising a polarized light source. The light beam C1 and C2 are polarized in the first direction, and light beam C3 is polarized in a second direction different from the first direction. Light beams C1 and C3 are on-axis beams, and light beam C2 is an off-axis beam. In Mode 1, the switchable LC layer 1104 is in a first state that passes light without scattering, i.e., a non-scattering state. With the indicated polarizations, light polarized in the second direction (C3) is undesirably polarized light and thus is blocked (or reflected if a reflective polarizer is present) by the rear polarizer 1101. The light beams C1 and C2 polarized in the first direction are transmitted through the rear polarizer 1101. In Mode 1, the polarization of the off-axis light is rotated by the liquid crystal structure of the LC layer 1104, and thus the off-axis light subsequently is absorbed by the front polarizer 1107. The rotation of polarization of the off-axis light can be achieved by several methods, including for example using planar aligned liquid crystal with bias voltage applied; a vertical aligned liquid crystal, and a hybrid aligned liquid crystal in which the alignment at one substrate is planar while the alignment of the other substrate is vertical. In contrast, the on-axis light C2 of the first polarization direction is transmitted through the switchable view angle control LCD 22 and is emitted from the viewing side, ultimately to be emitted from the broader display device substantially only in an on-axis direction. In this manner, the narrow angle view mode is achieved in that essentially only the on-axis light is emitted.

In Mode 2 as depicted in FIG. 12, the switchable LC layer 1104 is in a second state that scatters light, i.e., a scattering state. In particular, all light of the first polarization direction C4 is scattered. This can be achieved by multiple methods, including for example using a polymer dispersed liquid crystal, a multicomponent liquid crystal containing a mixture of negative and positive dielectric anisotropy liquid crystals, or using a liquid crystal doped with ionic contaminants. In these examples, when a sufficient voltage is applied the LC layer 1104 scatters light by inducing a chaotic liquid crystal director alignment. In addition, this chaotic liquid crystal director no longer rotates off-axis polarization eliminating the off-axis light screening effect. Accordingly, both on-axis and off-axis axis light is scattered and transmitted through the switchable view angle control LCD 22, and subsequently emitted from the viewing side. The light ultimately is emitted from the display system in a scattered fashion across a wide viewing angle. In this manner, the wide angle view mode is achieved.

Figure 13:
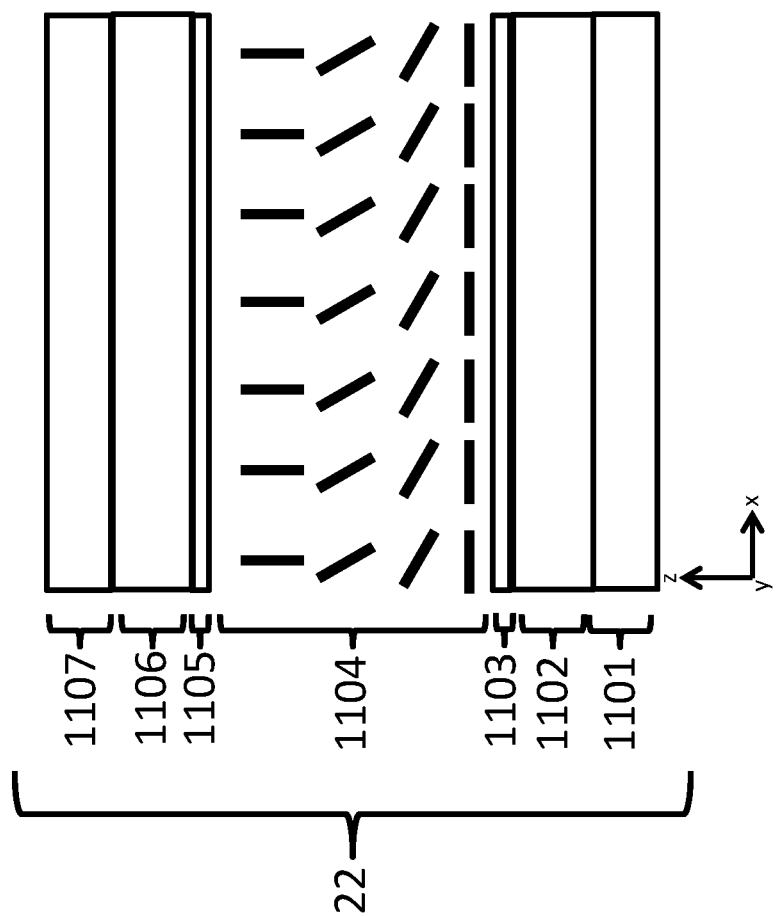
FIG. 13 is a drawing depicting an asymmetric viewing angle control using a TN HAN configuration of a switchable scattering device.

FIG. 13 is a drawing depicting a specific type of viewing angle control LCD 22 using a ionically doped hybrid aligned nematic (HAN) configuration utilizing a layer structure comparably as in FIGS. 11 and 12. A first LC alignment layer 1105 induces vertical LC alignment and a second alignment layer 1103 induces planar alignment. The LC is doped with ionic contaminants. With no voltage applied across the LC layer 1104, a narrow angle view mode is achieved as shown in FIG. 11. When a sufficient voltage is applied the LC layer 1104 scatters light by inducing a chaotic liquid crystal director alignment thus enabling the wide view mode as shown in FIG. 12. The chaotic liquid crystal director no longer rotates off-axis polarization eliminating the off-axis light screening effect. The first electrodes pertaining to the first electrode substrate 1106 and/or the second electrodes pertaining to the second electrode substrate 1102 may be patterned.

An aspect of the invention is an enhanced light-emitting device that has enhanced directional light emission, and enhanced on-axis light emission in particular. In exemplary embodiments, a light-emitting device includes a layer structure that includes from a non-emitting side: a first electrode layer; a first charge transport layer; an emissive layer; a second charge transport layer; a second electrode layer; an optically transparent layer; and a partially transmitting reflector layer. The light-emitting device comprises a plurality of regions and each region emits light of a different wavelength, such as for example red, green, and blue light-emitting regions. The optically transparent layer is present in at least one of the plurality of regions. The light emitting device may include one or more of the following features, either individually or in combination.

In exemplary embodiment of the light emitting device, the optically transparent layer is present in more than one of the plurality of regions, and a thickness of the optically transparent layer differs in at least two of the plurality of regions.

In exemplary embodiment of the light emitting device, the optically transparent layer is present in each of the plurality of regions, and a thickness of the optically transparent layer differs in each of the plurality of regions.

In exemplary embodiment of the light emitting device, the emissive layer comprises quantum dots and the quantum dots differ in each of the plurality of regions to generate the light of different wavelengths.

In exemplary embodiment of the light emitting device, the emissive layer comprises a layer of mixed quantum dots to generate light emission of at least one color, and the light emitting device further comprises a color filter disposed on the partially transmitting reflector layer in each of the plurality of regions to transmit the light of different colors.

In exemplary embodiment of the light emitting device, the plurality of regions includes a red light emitting region, a green light emitting region, and a blue light emitting region.

In exemplary embodiment of the light emitting device, the thickness of the optically transparent layer is thickest in the red light emitting region, thinnest in the blue light emitting region, and of an intermediate thickness between the thickest and thinnest thicknesses in the green light emitting region.

In exemplary embodiment of the light emitting device, the first electrode layer is an anode, the first charge transport layer includes a hole transport layer, the second charge transport layer includes an electron transport layer, and the second electrode layer is the cathode.

In exemplary embodiment of the light emitting device, the first electrode layer is a cathode, the first charge transport layer includes an electron transport layer, the second charge transport layer includes a hole transport layer, and the second electrode layer is an anode.

In exemplary embodiment of the light emitting device, the light-emitting device further includes a substrate upon which the layer structure is deposited, the substrate being located on a non-emitting side of the layer structure.

In exemplary embodiment of the light emitting device, the second electrode layer is a partially transmitting reflecting layer, and/or the first electrode layer is reflective.

In exemplary embodiment of the light emitting device, the light-emitting device further includes a scattering layer disposed on the partially transmitting reflector that scatters the emitted light.

In exemplary embodiment of the light emitting device, the scattering layer is a diffractive element.

In exemplary embodiment of the light emitting device, the scattering layer comprises a switchable liquid crystal device that is switchable between a scattering mode that scatters light and a non-scattering mode that does not scatter light.

In exemplary embodiment of the light emitting device, the switchable liquid crystal device has a twisted hybrid nematic (TN HAN) configuration.

In exemplary embodiment of the light emitting device, the switchable liquid crystal device has an ionically doped hybrid aligned nematic (HAN) configuration.

In exemplary embodiment of the light emitting device, the device further includes a patterned optically transparent layer and a patterned partially transmitting reflector layer so that a first set of pixels or subpixels has a first type of luminance against viewing angle response, and a second set of pixels or subpixels has a second type of luminance against viewing angle response, wherein the first and second luminance against viewing angle responses are different from each other.

Another aspect of the invention is a display system including an array of light-emitting devices according to any of the embodiments, and an image control unit configured to receive an input image and drive the array of light-emitting devices to generate an output image. The display device may include one or more of the following features, either individually or in combination.

In exemplary embodiment of the light display system, the system further includes a scattering layer disposed on the partially transmitting reflector of at least a portion of the light-emitting devices that scatters the emitted light.

In exemplary embodiment of the light display system, the scattering layer is patterned so that a first set of regions of the plurality of regions has a first type of luminance against viewing angle response, and a second set of regions of the plurality of regions has a second type of luminance against viewing angle response, and wherein the first and second luminance against viewing angle responses are different from each other.

In exemplary embodiment of the light display system, the first luminance against viewing angle response is a narrow viewing angle mode and the second luminance against viewing angle response is wide viewing angle mode relative to the narrow viewing angle mode.

In exemplary embodiment of the light display system, the scattering layer comprises a switchable liquid crystal device that is switchable between a scattering mode that scatters light and a non-scattering mode that does not scatter light, and the image control unit is configured to generate the patterning of the scattering layer by switching the scattering layer in each of the regions to be scattering or non-scattering in accordance with a predetermined pattern.

In exemplary embodiment of the light display system, the first luminance against viewing angle response is a narrow viewing angle mode and the second luminance against viewing angle response is wide viewing angle mode relative to the narrow viewing angle mode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention are applicable to many emissive display devices, such as for example QLED and OLED display devices. Examples of such devices include mobile phones including smartphones, personal digital assistants (PDAs), tablet and laptop computers, televisions, and like display devices.

REFERENCE SIGNS LIST

10—exemplary display system
11—red pixel
12—green pixel
13—blue pixel
14—red wavelength light
15—green wavelength light
16—blue wavelength light
20—conventional light emitting device (left side)
21—light-emitting device of present disclosure (right side)
22—exemplary view angle control LCD
61—red emission region
62—green emission region
63—blue emission region
64—red light
65—green light
66—blue light
71—red emission region
72—green emission region
73—blue emission region
81—red light
81a—red pixel having first luminance profile
81b—red pixel having second luminance profile
82—green light
82a—green pixel having first luminance profile
82b—green pixel having second luminance profile
83—blue light
83a—blue pixel having first luminance profile
83b—blue pixel having second luminance profile
100—light-emitting device
101—substrate
102—anode
103—hole transport/injection layer
104—hole transport/injection layer
105—light-emitting or emissive layer
106—electron transport layer
107—cathode
108—electron transport layer
109—electron transport layer
201—first electrode
202—functional layers
203—partially reflective second electrode
204—transparent region
205—partially reflective layer
300—light-emitting device
301—substrate
302—first electrode layer
303—hole injection layer
304—hole transport layer
305—emissive layer
306—electron transport layer
307—second electrode layer
308—optically transparent layer
309—partially reflecting layer
401—blue light emission curve
402—green light emission curve
403—blue light emission curve
600—exemplary light-emitting device
601—first electrode layer
602—functional layers
602a—hole transport layer
602b—emissive layer
602c—electron transport layer
603—second electrode layer
604—transparent layer
605—partially reflective layer
606—transparent layer
607—transparent layer
610—glass substrate
700—exemplary light-emitting device
701—first electrode layer
702—functional layers 702a—hole transport layer
702b—emissive layer
702c—electron transport layer
703—second electrode layer
704—transparent layer
705—partially reflective layer
706—transparent layer
707—transparent layer
708—red filter layer
709—green filter layer
710—blue filter layer
720—glass substrate
800—exemplary light-emitting device
806—scattering layer
1000—image control unit
1001—input image
1002—output image
1003—memory device
1004—look-up table
1005—light-emitting device array
1101—rear polarizer
1102—second electrode substrate
1103—second alignment layer
1104—liquid crystal LC layer
1105—first LC alignment layer
1106—first electrode substrate
1107—front polarizer

What is claimed is:

1. A light-emitting device comprising a layer structure that includes from a non-emitting side:
a first electrode layer;
a first charge transport layer;
an emissive layer;
a second charge transport layer;
a second electrode layer, wherein the second electrode layer is partially transmitting relfecting layer;
an optically transparent layer; and
a partially transmitting reflector layer;
wherein in response to a voltage difference applied between the first and second electrode layers, the first and second charge transport layers respectively supply first and second charges to the emissive layer where the first and second charges combine to emit light, the light being transmitted through the optically transparent layer and the partially transmitting reflector layer; and
wherein the light-emitting device comprises a plurality of regions and each region emits light of a different wavelength, and the optically transparent layer is present in at least one of the plurality of regions.

2. The light emitting device of claim 1, wherein the optically transparent layer is present in more than one of the plurality of regions, and a thickness of the optically transparent layer differs in at least two of the plurality of regions.

3. The light emitting device of claim 1, wherein the optically transparent layer is present in each of the plurality of regions, and a thickness of the optically transparent layer differs in each of the plurality of regions.

4. The light-emitting device of claim 1, wherein the emissive layer comprises quantum dots and the quantum dots differ in each of the plurality of regions to generate the light of different wavelengths.

5. The light-emitting device of claim 1, wherein the emissive layer comprises a layer of mixed quantum dots to generate light emission of at least one color, and the light emitting device further comprises a color filter disposed on the partially transmitting reflector layer in each of the plurality of regions to transmit the light of different colors.

6. The light-emitting device of claim 1, wherein the plurality of regions includes a red light emitting region, a green light emitting region, and a blue light emitting region.

7. The light-emitting device of claim 6; wherein the thickness of the optically transparent layer is thickest in the red light emitting region, thinnest in the blue light emitting region, and of an intermediate thickness between the thickest and thinnest thicknesses in the green light emitting region.

8. The light emitting device of claim 1, wherein the first electrode layer is an anode, the first charge transport layer includes a hole transport layer, the second charge transport layer includes an electron transport layer, and the second electrode layer is the cathode.

9. The light emitting device of claim 1, wherein the first electrode layer is a cathode, the first charge transport layer includes an electron transport layer, the second charge transport layer includes a hole transport layer, and the second electrode layer is an anode.

10. The light-emitting device of claim 1, further comprising a substrate upon which the layer structure is deposited, the substrate being located on a non-emitting side of the layer structure.

11. The light-emitting device of claim 1, wherein the first electrode layer is reflective.

12. The light-emitting device of claim 1, further comprising a scattering layer disposed on the partially transmitting reflector that scatters the emitted light.

13. The light-emitting device of claim 12, wherein the scattering layer is a diffractive element.

14. The light-emitting device of claim 1, further comprising a patterned optically transparent layer and a patterned partially transmitting reflector layer so that a first set of pixels or subpixels has a first type of luminance against viewing angle response, and a second set of pixels or subpixels has a second type of luminance against viewing angle response, wherein the first and second luminance against viewing angle responses are different from each other.

15. A light-emitting device comprising a layer structure that includes from a non-emitting side:
a first electrode layer;
a first charge transport layer;
an emissive layer;
a second charge transport layer;
a second electrode layer;
an optically transparent layer; and
a partically transmitting reflector layer;
wherein in response to a voltage difference applied between the first and second electrode layers, the first and second charge transport layers respectively supply first and second charges to the emissive layer where the first and second charges combine to emit light, the light being transmitted through the optically transparent layer and the partially transmitting reflector layer; and
the light-emitting device comprises a plurality of regions and each region emits light of a different wavelength, and the optically transparent layer is present in at least one of the plurality of regions;
the light emitting device comprises a scattering layer disposed on the partially transmitting reflector that scatters the emitted light, wherein the scattering layer is a diffractive element and comprises a switchable liquid crystal device that is switchable between a scattering mode that scatters light and a non-scattering mode that does not scatter light.

16. The light-emitting device of claim 15, wherein the switchable liquid crystal device has an ionically doped hybrid aligned nematic (HAN) configuration.

17. A display system comprising:
- an array of light-emitting devices according to claim 1; and
- an image control unit configured to receive an input image and drive the array of light-emitting devices to generate an output image.

18. The display system of claim 17, further comprising a scattering layer disposed on the partially transmitting reflector of at least a portion of the light-emitting devices that scatters the emitted light.

19. The display system of claim 17, wherein the scattering layer is patterned so that a first set of regions of the plurality of regions has a first type of luminance against viewing angle response, and a second set of regions of the plurality of regions has a second type of luminance against viewing angle response, and wherein the first and second luminance against viewing angle responses are different from each other.

20. The display system of claim 19, wherein the first luminance against viewing angle response is a narrow viewing angle mode and the second luminance against viewing angle response is wide viewing angle mode relative to the narrow viewing angle mode.

* * * * *